(12) United States Patent
Jeon et al.

(10) Patent No.: US 9,196,506 B2
(45) Date of Patent: Nov. 24, 2015

(54) METHOD FOR MANUFACTURING INTERPOSER

(71) Applicant: SAMSUNG ELECTRO-MECHANICS CO., LTD., Suwon Gyunggi-Do (KR)

(72) Inventors: Hyung Jin Jeon, Gunpo (KR); Jong In Ryu, Suwon (KR); Seung Wan Shin, Hwaseong (KR); Seon Hee Moon, Seoul (KR); Young Do Kweon, Seoul (KR); Seung Wook Park, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 580 days.

(21) Appl. No.: 13/632,614

(22) Filed: Oct. 1, 2012

(65) Prior Publication Data

US 2013/0029031 A1 Jan. 31, 2013

Related U.S. Application Data

(62) Division of application No. 12/654,372, filed on Dec. 17, 2009, now abandoned.

(30) Foreign Application Priority Data

Sep. 14, 2009 (KR) .......................... 10-2009-0086614

(51) Int. Cl.
| | |
|---|---|
| *H01L 21/48* | (2006.01) |
| *H01L 23/498* | (2006.01) |
| *H05K 3/46* | (2006.01) |
| *H05K 3/24* | (2006.01) |
| *H05K 3/42* | (2006.01) |

(52) U.S. Cl.
CPC .......... *H01L 21/486* (2013.01); *H01L 21/4857* (2013.01); *H01L 23/49822* (2013.01);

(Continued)

(58) Field of Classification Search
CPC ........... H05K 1/16; H05K 1/167; H05K 1/05; H05K 3/46; H05K 3/244; H05K 3/427; H05K 3/4602; H05K 3/4605; H05K 3/4644; H05K 2201/0979; H05K 2201/10378; H01L 21/4857; H01L 21/486; H01L 23/49822; H01L 23/49827; H01L 2225/06572; H01L 2924/0002

See application file for complete search history.

(56) References Cited

U.S. PATENT DOCUMENTS

| 4,963,697 A | 10/1990 | Peterson et al. |
|---|---|---|
| 6,376,049 B1 | 4/2002 | Asai et al. |

(Continued)

FOREIGN PATENT DOCUMENTS

| JP | 2003069185 A * | 3/2003 |
|---|---|---|
| KR | 10-2008-0053386 | 6/2008 |

(Continued)

OTHER PUBLICATIONS

Korean Office Action issued Feb. 18, 2011 in corresponding Korean Patent Application No. 10-2009-0086614.

(Continued)

*Primary Examiner* — Carl Arbes
(74) *Attorney, Agent, or Firm* — NSIP Law

(57) ABSTRACT

A method for manufacturing an interposer includes forming a via hole in an insulation plate including a resin or a ceramic; simultaneously forming resists for a first upper redistribution layer on the top surface of the insulation plate, and a resistor for a lower redistribution layer on the bottom surface of the insulation plate; plating copper to fill the via hole and simultaneously forming the first upper redistribution layer and the lower redistribution layer along a designed circuit pattern; and forming a first upper protection layer and a lower protection layer to expose a portion of the first upper redistribution layer and a portion of the lower redistribution layer.

8 Claims, 4 Drawing Sheets

(52) U.S. Cl.
CPC ........ *H01L23/49827* (2013.01); *H05K 3/4602* (2013.01); *H01L 2225/06572* (2013.01); *H01L 2924/0002* (2013.01); *H05K 3/244* (2013.01); *H05K 3/427* (2013.01); *H05K 3/4605* (2013.01); *H05K 3/4644* (2013.01); *H05K 2201/0979* (2013.01); *H05K 2201/10378* (2013.01)

(56) References Cited

U.S. PATENT DOCUMENTS

| | | |
|---|---|---|
| 6,930,258 B1 | 8/2005 | Kawasaki et al. |
| 2004/0118604 A1 | 6/2004 | Dory et al. |
| 2006/0163740 A1 | 7/2006 | Ohno et al. |

FOREIGN PATENT DOCUMENTS

| | | |
|---|---|---|
| KR | 10-2009-0045012 | 5/2009 |
| WO | 2008/013054 | 1/2008 |

OTHER PUBLICATIONS

U.S. Office Action mailed Feb. 1, 2012 in co-pending U.S. Appl. No. 12/654,372.

U.S. Office Action mailed May 30, 2012 in co-pending U.S. Appl. No. 12/654,372.

U.S. Appl. No. 12/654,372, filed Dec. 17, 2009, Hyung Jin Jeon et al., Samsung Electro-Mechanics Co., Ltd.

\* cited by examiner

METHOD FOR MANUFACTURING INTERPOSER

CROSS-REFERENCE TO RELATED APPLICATIONS

This application is a divisional of U.S. application Ser. No. 12/654,372, filed Dec. 17, 2009, which claims the priority of Korean Patent Application No. 10-2009-0086614 filed on Sep. 14, 2009, in the Korean Intellectual Property Office, the disclosures of which are incorporated herein by reference.

BACKGROUND

1. Field

The present invention relates to an interposer, and more particularly, to an interposer which can be manufactured at low costs by reducing material costs and manufacturing costs.

2. Description of the Related Art

The trend within the electronics industry is to manufacture lighter, smaller, faster, multi-functional, high-performance and high-reliability products at low cost. One of most important technologies within the industry is a package technology. In order to implement smaller and slimmer packages, interposer technology for realizing 3D structures and ensuring reliability is required.

A typical interposer is manufactured using silicon through a semiconductor manufacturing process. However, when the interposer is manufactured using silicon, material costs and manufacturing costs increase.

SUMMARY

An aspect of the present invention provides an interposer which can be manufactured at low costs by reducing material costs and manufacturing cost.

According to an aspect of the present invention, there is provided an interposer including: an insulation plate where a via is formed, the insulation plate including a resin or a ceramic; a first upper redistribution layer formed on the top surface of the insulation plate to be electrically connected to the via along a designed circuit pattern; a first upper protection layer laminated to expose a portion of the first upper redistribution layer and protecting the first upper redistribution layer; a second upper redistribution layer electrically connected to the first upper redistribution layer and laminated along a designed circuit pattern; a second upper protection layer laminated to expose a portion of the second upper redistribution layer and protecting the second upper redistribution layer; and an under bump metallization (UBM) formed at the exposed portion of the second upper redistribution layer.

The interposer may further include: a lower redistribution layer formed on the bottom surface of the insulation plate to be electrically connected to the via along a designed circuit pattern; a lower protection layer laminated to expose a portion of the lower redistribution layer and protecting the lower redistribution layer; and an under bump metallization (UBM) formed at the exposed portion of the lower redistribution layer.

According to another, aspect of the present invention, there is provided a method for manufacturing an interposer, the method including: forming a via hole in an insulation plate including a resin or a ceramic; simultaneously forming a resists for a first upper redistribution layer on the top surface of the insulation plate, and a resistor for a lower redistribution layer on the bottom surface of the insulation plate; plating copper to fill the via hole and simultaneously forming the first upper redistribution layer and the lower redistribution layer along a designed circuit pattern; and forming a first upper protection layer and a lower protection layer to expose a portion of the first upper redistribution layer and a portion of the lower redistribution layer.

The method may further include forming an under bump metallization (UBM) on the first upper redistribution layer and the lower redistribution layer exposed after the formation of the first upper protection layer and the lower protection layer.

The method may further include: forming a second upper redistribution layer on the top surface of the insulation plate along a designed circuit pattern; and forming a second upper protection layer to expose a portion of the second upper redistribution layer.

The method may further include forming an under bump metallization (UBM) on the second upper redistribution layer exposed after the formation of the second upper protection layer.

The second upper redistribution layer and the second upper protection layer may be formed using a semiconductor manufacturing process in order for implementation of fine pitches.

The forming of the via hole on the insulation plate may include forming a seed layer in a region where the resin or ceramic inside the insulation plate is exposed.

The plating of the copper and the forming of the first upper redistribution layer and the lower redistribution layer may include plating the copper on both sides of the insulation plate and the via hole, and removing the resists.

The insulation plate may be a copper clad laminate (CCL).

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Figure 1:
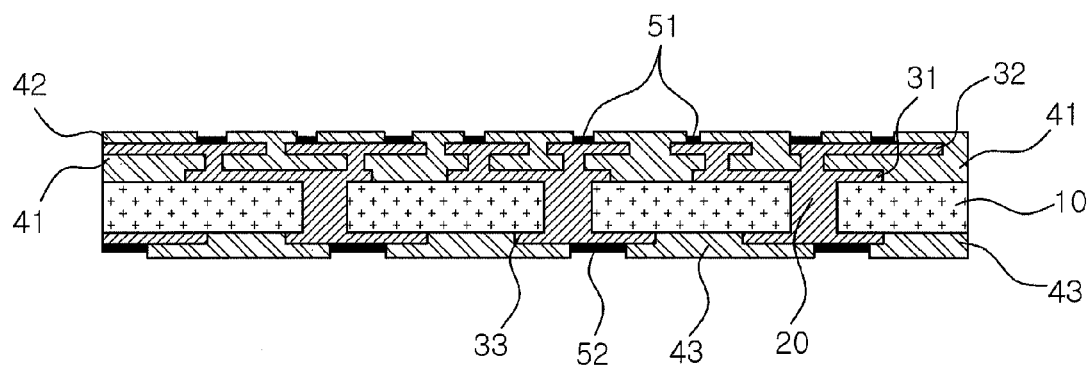
FIG. 1 is a cross-sectional view of an interposer according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Further, when a part (or element, device, etc.) is referred to as being "connected" to another part (or element, device, etc.), it should be understood that the former can be "directly connected" to the latter, or "indirectly connected" to the latter via an intervening part (or element, device, etc.). Furthermore, when it is described that one comprises (or includes or has) certain elements, it should be understood that it may comprise (or include or has) only those elements, or it may comprise (or include or have) other elements as well as those elements if there is no specific limitation.

FIG. 1 is a cross-sectional view of an interposer according to an embodiment of the present invention.

Referring to FIG. 1, the interposer according to the embodiment of the present invention may include an insulation plate 10 and a via 12. The insulation plate 10 may include a resin or a ceramic, and the via 12 passes through the insulation plate 10 in a thickness direction. The insulation plate 10 may be a copper clad laminate (CCL) in which copper layers are laminated on the top and bottom surfaces thereof. The via 20 may be formed of a conductive material, e.g., copper.

A first upper redistribution layer (RDL) 31 may be formed on the top surface of the insulation plate 10 along a designed circuit pattern, and a first upper protection layer 41 protecting the first upper redistribution layer 31 may be formed on the top surface of the first upper redistribution layer 31 to expose a portion of the first upper redistribution layer 31. The first upper redistribution layer 31 may be formed of a conductive material.

In addition, a second upper redistribution layer 32 may be formed along a circuit pattern designed to expose a portion of the first upper protection layer 41, and a second upper protection layer 42 may be formed on the top surface of the second upper redistribution layer 32 to expose a portion of the second upper redistribution layer 32. The second upper redistribution layer 32 may be formed of a conductive material.

If necessary, an under bump metallization (UMB) for the formation of bumps may be formed at the exposed portion of the second upper redistribution layer 32.

A lower redistribution layer 33 may be formed on the bottom surface of the insulation plate 10 along a designed circuit pattern, and a lower protection layer 43 protecting the lower redistribution layer 33 may be formed on the bottom surface of the lower redistribution layer 33 to expose a portion of the lower redistribution layer 33. The lower redistribution layer 33 may be formed of a conductive material.

An under bump metallization for the formation of bumps may be formed at the exposed portion of the lower redistribution layer 33.

FIGS. 2A to 2L illustrate a method for manufacturing an interposer according to another embodiment of the present invention.

Figure 2A:
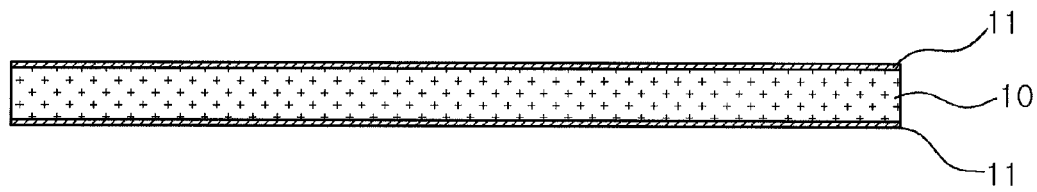
FIGS. 2A to 2L illustrate a method for manufacturing an interposer according to another embodiment of the present invention.

FIG. 2A is a schematic cross-sectional view of a copper clad laminate 11 where copper foil layers 11 are formed on both surfaces of an insulation plate 10 including a resin or a ceramic.

In the case of using a silicon wafer, much expense may be incurred in making the silicon wafer having a desired thickness. However, in the case of using a copper clad laminate, the cost reduction effect is achieved. In addition, since a large-sized copper clad laminate, e.g., 405×510, may be used, productivity is also improved.

Figure 2B:
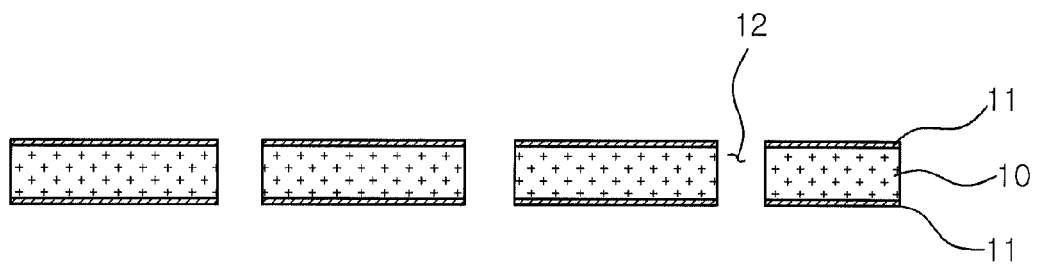

Referring to FIG. 2B, a via hole 12 may be formed in the insulation plate 10 in a thickness direction. The via hole 12 may be formed through a mechanical method, such as laser cutting or drilling.

In the case of using the silicon wafer, much expense may be incurred because a via hole is formed by an etching process. However, in the case of using the insulation plate 10, the cost reduction effect is achieved because the via hole 12 may be formed through a mechanical method.

Figure 2C:
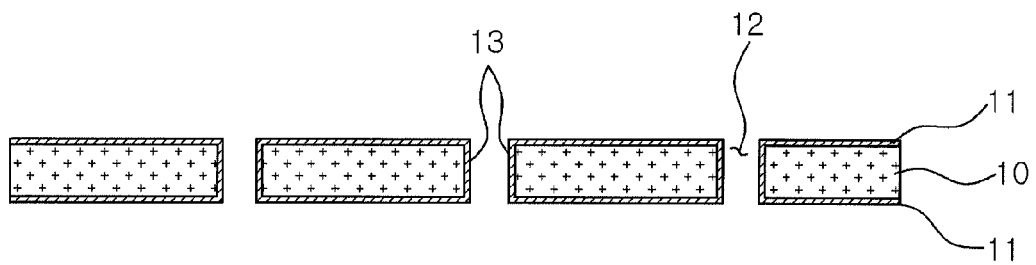

Referring to FIG. 2C, seed layers for the formation of a via may be formed on both sides of the via holes 12. The seed layer may be formed of copper.

Figure 2D:
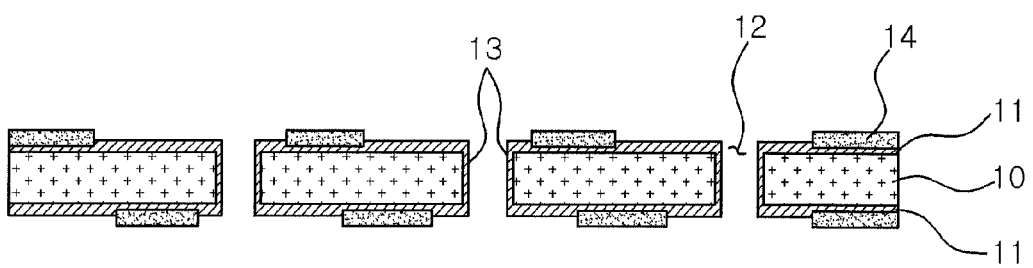

Referring to FIG. 2D, resists 14 for the formation of redistribution layers may be formed on both surfaces of the insulation plate 10 where the via hole 12 is formed.

Figure 2E:
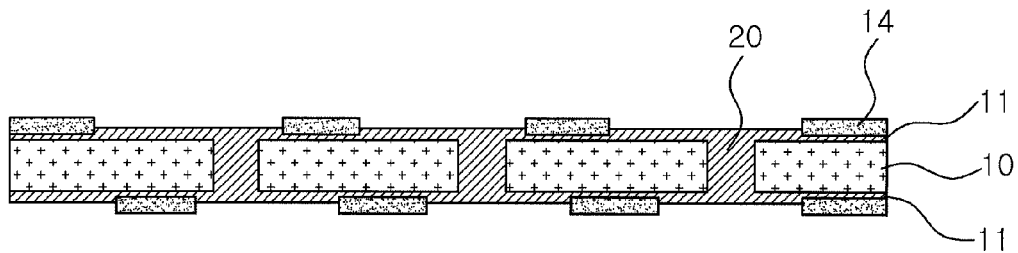
Figure 2F:
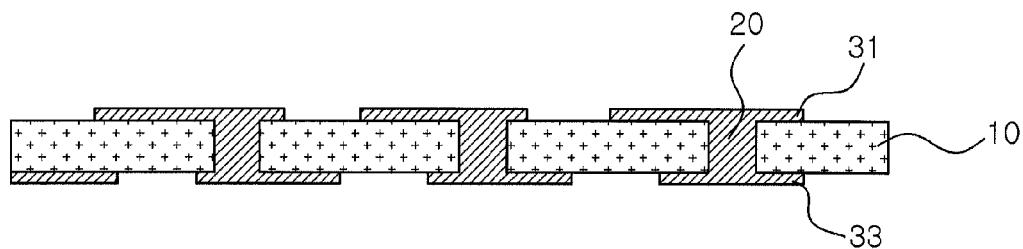

Referring to FIGS. 2E and 2F, a conductive metal is plated on the insulation plate 10 where the resists 14 are formed on both surfaces thereof, and the resists 14 are removed to form a first upper redistribution layer 31, a lower redistribution layer 33, and a via 20 at the same time. The conductive metal used in the plating may be copper.

In the case of using the silicon wafer, the via and the redistribution layers cannot be formed at the same time, and individual processes must be performed. Hence, much time and expense are incurred. In the case of using the copper clad laminate, the via 20, the first upper redistribution layer 31, and the lower redistribution layer 33 can be formed at the same time, but it is difficult to implement fine pitches. However, there is no great problem because the first upper redistribution layer 31 and the lower redistribution layer 33 are generally used as the ground interconnection.

When the process of removing the resists illustrated in FIG. 2F is completed, the large-sized insulation plate 10 is processed in a wafer form. Therefore, since a semiconductor manufacturing process can be applied, fine pitches for subsequent redistribution layers may be implemented.

Figure 2G:
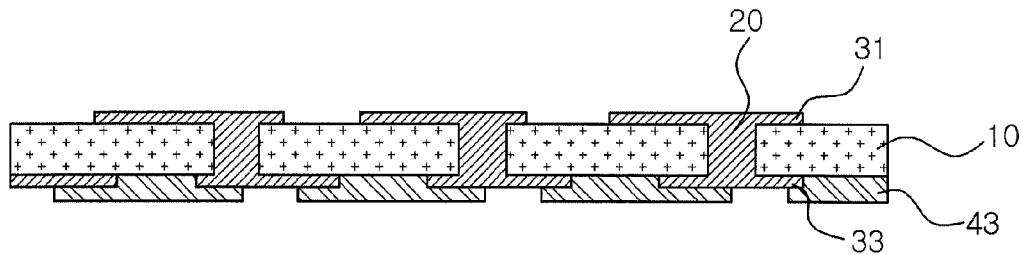

Referring to FIG. 2G, a lower protection layer 43 protecting the lower redistribution layer 33 may be formed on the bottom surface of the insulation plate 10. As illustrated in FIG. 2G, the lower protection layer 43 may be formed to expose a portion of the lower redistribution layer 33. Furthermore, the lower protection layer 43 may be formed of an insulating material.

Figure 2H:
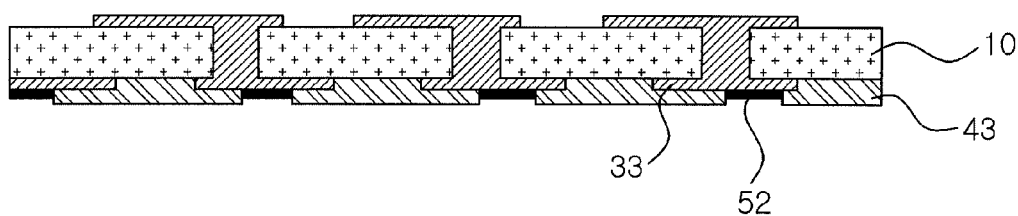

Referring to FIG. 2H, an under bump metallization 52 for the formation of bumps may be formed on the exposed lower redistribution layer 33. Furthermore, although not illustrated, necessary bumps may be formed on the under bump metallization 52.

Figure 2I:
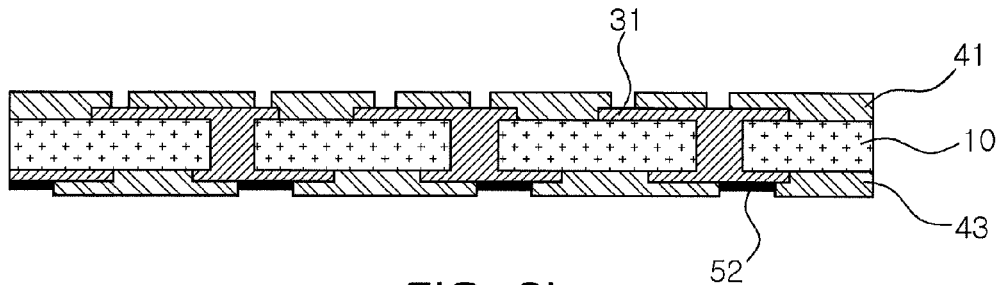

Referring to FIG. 2I, a first upper protection layer 41 protecting the first upper redistribution layer 31 may be formed on the top of the insulation plate 10. As illustrated in FIG. 2I, the first upper protection layer 41 may also be formed to expose a portion of the first upper redistribution layer 31. Furthermore, the first upper protection layer 41 may be formed of an insulating material.

Figure 2J:
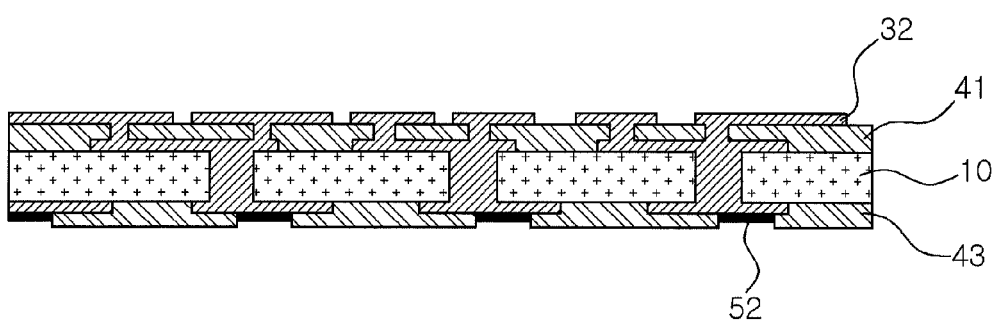

Referring to FIG. 2J, a second upper redistribution layer 32 may be on the top surface of the first upper protection layer 41 along a designed circuit pattern. The second upper redistribution layer 32 may be formed of a conductive material. As illustrated in FIG. 2J, the second upper redistribution layer 32 may be formed to expose a portion of the first upper protection layer 41.

Figure 2K:
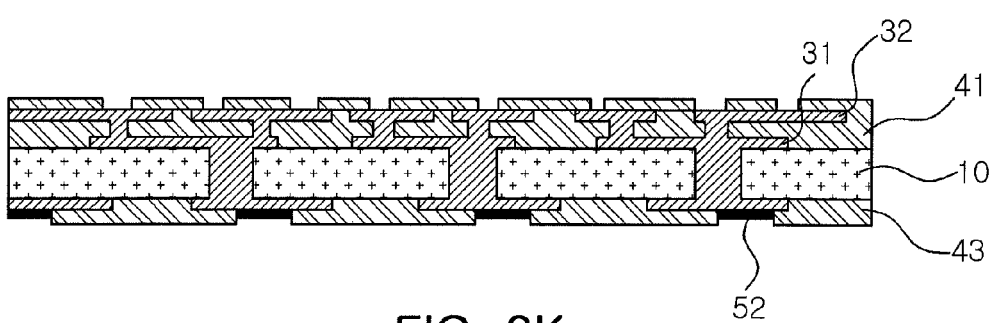

Referring to FIG. 2K, a second upper protection layer 42 protecting the second upper redistribution layer 32 may be formed on the top surface of the second upper redistribution layer 32. As illustrated in FIG. 2K, the second upper protection layer 42 may be formed to expose a portion of the second upper redistribution layer 32. Furthermore, the second upper protection layer 42 may be formed of an insulating material.

Figure 2L:
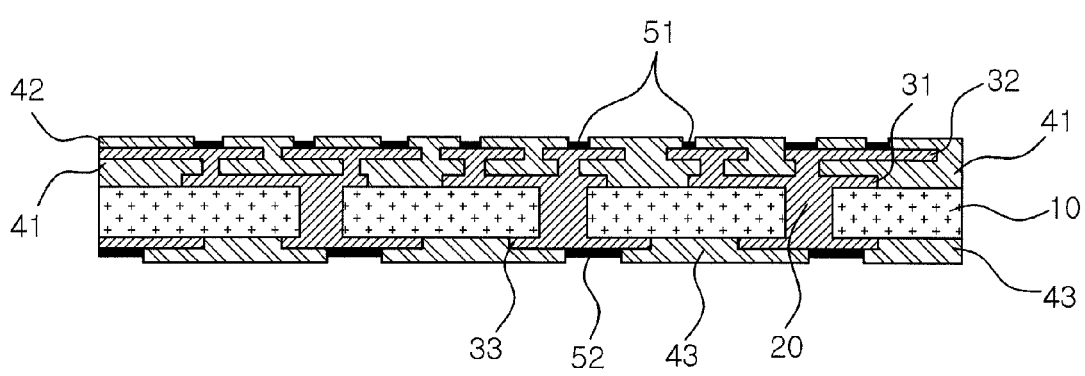

Referring to FIG. 2L, an under bump metallization 51 for formation of bumps may be formed at the exposed portion of the second upper redistribution layer 32. Although not illustrated in FIG. 2L, necessary bumps may be formed on the under bump metallization 51.

Moreover, although a two-layered redistribution layer and a protection layer are formed on the top surface of the insulation plate 10 and a single-layered redistribution layer and a protection layer are formed on the bottom surface of the insulation plate 10, a plurality of redistribution layers and a plurality of protection layers may be further laminated onto the top and bottom surfaces of the insulation plate 10.

As set forth above, according to exemplary embodiments of the invention, the interposer may be provided at low cost by reducing material costs and manufacturing costs because the interposer is manufactured using an insulation plate including a resin or a ceramic, instead of a silicon wafer.

Moreover, since the large-sized insulation plate may be used, a large quantity of interposers can be produced in a single process, thereby improving the productivity of the interposers.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for manufacturing an interposer, the method comprising:
    forming a via hole in an insulation plate comprising a resin or a ceramic;
    simultaneously forming resists for formation of a first upper redistribution layer on the top surface of the insulation plate, and a lower redistribution layer on the bottom surface of the insulation plate;
    plating copper to fill the via hole and simultaneously forming the first upper redistribution layer and the lower redistribution layer along a designed circuit pattern; and
    forming a first upper protection layer and a lower protection layer to expose a portion of the first upper redistribution layer and a portion of the lower redistribution layer.

2. The method of claim 1, further comprising forming an under bump metallization (UBM) on the first upper redistribution layer and the lower redistribution layer exposed in response to the formation of the first upper protection layer and the lower protection layer.

3. The method of claim 1, further comprising:
    forming a second upper redistribution layer on the top surface of the insulation plate along a designed circuit pattern; and
    forming a second upper protection layer to expose a portion of the second upper redistribution layer.

4. The method of claim 3, further comprising forming an under bump metallization (UBM) on the second upper redistribution layer exposed after the formation of the second upper protection layer.

5. The method of claim 3, wherein the second upper redistribution layer and the second upper protection layer are formed using a semiconductor manufacturing process in order for implementation of fine pitches.

6. The method of claim 1, wherein the forming of the via hole on the insulation plate comprises forming a seed layer in a region where the resin or ceramic inside the insulation plate is exposed.

7. The method of claim 1, wherein the plating of the copper and the forming of the first upper redistribution layer and the lower redistribution layer comprise plating the copper on both sides of the insulation plate and the via hole, and removing the resists.

8. The method of claim 1, wherein the insulation plate is a copper clad laminate (CCL).

* * * * *